United States Patent [19]

Waggener

[11] 4,215,425

[45] Jul. 29, 1980

[54] APPARATUS AND METHOD FOR FILTERING SIGNALS IN A LOGGING-WHILE-DRILLING SYSTEM

[75] Inventor: William N. Waggener, Sarasota, Fla.

[73] Assignee: Sangamo Weston, Inc., Norcross, Ga.

[21] Appl. No.: 881,459

[22] Filed: Feb. 27, 1978

[51] Int. Cl.² .............................................. G01V 1/40
[52] U.S. Cl. ..................................... 367/83; 340/853; 375/79; 375/83
[58] Field of Search ....... 340/18 LD, 18 NC, 18 FM, 340/18 P, 180, 186; 325/30, 320, 420; 178/88, 67; 33/307

[56] References Cited

U.S. PATENT DOCUMENTS

| | | | |
|---|---|---|---|
| 3,530,472 | 9/1970 | Fukata et al. | 343/228 |
| 3,626,301 | 12/1971 | Develet | 325/420 |
| 3,789,355 | 1/1974 | Patton | 340/18 LD |
| 3,793,486 | 2/1974 | Koziol | 325/30 |
| 3,794,928 | 2/1974 | Stump et al. | 329/104 |
| 3,803,501 | 4/1974 | Jones | 329/104 |
| 4,001,775 | 1/1977 | Sexton et al. | 340/18 LD |
| 4,065,722 | 12/1977 | Francis | 325/320 |

OTHER PUBLICATIONS

Huang, "Predistortion Equalization For PSK Modems," 6/77, pp. 154–158, IEEE Intern. Conf. on Communications, vol. 13, Chicago, Ill.

Gitlin et al. "Optimization of Digital . . . Detectors," 9/76, pp, 963–970, IEEE Trans on Conmun., Com 24, #9.

Primary Examiner—Nelson Moskowitz

Attorney, Agent, or Firm—William R. Sherman; Kevin McMahon

[57] ABSTRACT

The disclosure is applicable for use in a logging-while-drilling apparatus for obtaining subsurface measurements during drilling in a fluid-filled borehole. Acoustic carrier waves are generated downhole in the borehole fluid and are PSK modulated in accordance with digital data representative of downhole measurements. The PSK modulation is obtained by momentarily unidirectionally either decreasing or increasing the frequency of the acoustic carrier signal until either a desired phase lag (for a decrease in frequency) or phase lead (for an increase in frequency) is imparted to the acoustic carrier signal. An uphole receiving subsystem includes transducers for converting the modulated acoustic carrier waves to electronic signals and circuitry for demodulating the electronic signals to recover the measurement information taken downhole. In accordance with an important feature of the invention, a filter is provided for selectively filtering the electronic signals before the demodulation thereof. The filter is provided with a bandpass characteristic having a center frequency which is displaced from the nominal frequency in the directon of the unidirectional decrease or increase of frequency applied when originally modulating the acoustic carrier waves. The center frequency is preferably offset from the nominal carrier frequency by an amount which is a function of the bit rate of the digital information, preferably an amount equal to one-half the bit rate of the digital information. In the preferred embodiment of the invention, the bandpass characteristic of the filter means is skewed in the same direction as the offset.

23 Claims, 9 Drawing Figures

4A

4B

4C

4D

4E

4F

4G    "0"    "1"    "0"    "0"

4H

APPARATUS AND METHOD FOR FILTERING SIGNALS IN A LOGGING-WHILE-DRILLING SYSTEM

BACKGROUND OF THE INVENTION

This invention relates to communication systems and, more particularly, to an improved apparatus and method for receiving and interpreting data signals being telemetered to the surface of the earth in a logging-while-drilling system.

Logging-while-drilling involves the transmission to the earth's surface of downhole measurements taken during drilling, the measurements generally being taken by instruments mounted just behind the drill bit. The prospect of continuously obtaining information during drilling with the entire string in place is clearly attractive. Nonetheless, logging-while-drilling systems have not yet achieved widespread commercial acceptance, largely due to problems associated with transmitting the measured information through the noisy and hostile environment of a borehole. Various schemes have been proposed for achieving transmission of measurement information to the earth's surface. For example, one proposed technique would transmit logging measurements by means of insulated electrical conductors extending through the drill string. This scheme, however, requires adaptation of drill string pipes including provision for electrical connections at the drill pipe couplings. Another proposed scheme employs an acoustic wave which would travel upward through the metal drill string, but the obvious high levels of interfering noise in a drill string are a problem in this technique. Another scheme, which appears particularly promising, utilizes a drilling fluid within the borehole as a transmission medium for acoustic waves modulated with the measurement information. Typically, drilling fluid or "mud" is circulated downward through the drill string and drill bit and upward through the annulus defined by the portion of the borehole surrounding the drill string. This is conventionally done to remove drill cuttings and maintain a desired hydrostatic pressure in the borehole. In the technique referred to, a downhole acoustic transmitter, known as a rotary valve or "mud siren", repeatedly interrupts the flow of the drilling fluid, and this causes an acoustic carrier signal to be generated in the drilling fluid at a frequency which depends upon the rate of interruption. The acoustic carrier is modulated as a function of downhole digital logging data. In a phase shift keying ("PSK") modulating technique, the acoustic carrier is modulated between two (or more) phase states. Various coding schemes are possible using PSK modulation. In a "non-return to zero" coding scheme, a change in phase represents a particular binary state (for example, a logical "1"), whereas the absence of a change of phase represents the other binary state (for example, a logical "0"). The phase changes are achieved mechanically by temporarily modifying the interruption frequency of the mud siren to a higher or lower frequency until a desired phase lag (or lead) is achieved, and then returning the mud siren to its nominal frequency. For example, if the nominal frequency of the mud siren is 12 Hz., a phase change of 180° can be obtained by temporarily lowering the frequency of the mud siren to 8 Hz. for 125 milliseconds (which is one period at 8 Hz. and one and one-half periods at 12 Hz.) and then restoring the mud siren frequency to 12 Hz. It is readily seen that a 180° phase shift could also be achieved by temporarily increasing the mud siren frequency for an appropriate period of time (i.e., to obtain a desired phase lead), and then returning to the nominal frequency.

In conventional (PSK) communications, the carrier phase is conventionally changed in alternate directions (that is, alternating lead and lag) so that the net change in carrier phase over a long period of time is close to zero. In a logging-while-drilling system wherein an electromechanical device, such as a mud siren, is employed to impart acoustic waves to the drilling fluid, it is preferable to effect all phase changes in the same direction (i.e. either all lags or all leads) which results in the technique for driving the mud siren more efficient and straightforward. (For example, if all phase changes are achieved by momentary decreases in frequency, it is never necessary to increase the frequency above the nominal frequency, and less drive power is needed for the mud siren. Also, the control circuitry can be less complex.) The term "unidirectional" PSK modulation means this type of modulation wherein all phase changes are in the same direction.

The modulated acoustic signal is received uphole by one or more transducers which convert the acoustic signal to an electrical signal. It is then necessary to recover the digital information which is contained in the modulation of the received signal. Briefly, this is achieved by first processing the received signals to extract the carrier signal. The reconstructed carrier is then used to synchronously demodulate the modulated electrical signal.

In the type of system described, a bandpass filter is typically employed at the receiver, the filter having a bandpass spectrum centered at the nominal carrier frequency and being used to detect the modulated carrier. Applicant has discovered, however, that employment of a filter centered at the nominal carrier frequency results in less than optimum performance. In particular, the unidirectional nature of the modulation results in the average carrier frequency being different from the nominal carrier frequency. Applicant has also recognized a further problem with using conventional existing filters in phase shift keying systems of the type described. A typical conventional filter design strives to attain a symmetrical spectral characteristic about the filter center frequency. However, the unidirectional nature of the modulation results in a symmetrical filter characteristic being a less than optimum match with the frequency characteristic of the transmitted signal.

It is an object of the present invention to provide a filter for use in detection in a phase shift keying transmission system of the type wherein modulation is achieved by temporary unidirectional modification of carrier frequency.

SUMMARY OF THE INVENTION

The present invention is particularly applicable for use in a logging-while-drilling apparatus for obtaining subsurface measurements during drilling in a fluid-filled borehole, and particularly to the receiving and uphole processing of these measurements. In an embodiment of the invention, a downhole sensing and transmitting subsystem is provided and includes means mountable on a drill string for obtaining measurement information. Acoustic carrier waves are generated downhole in the borehole fluid, carrier waves typically being generated at a selected relatively low frequency, for example a nominal frequency of 12 Hz. The downhole subsystem further includes means for PSK modulating the generated acoustic carrier waves in accordance with digital data representative of the measurements. The PSK modulation is obtained by momentarily unidirectionally either decreasing or increasing the frequency of the acoustic carrier signal until either a desired phase lag (for a decrease in frequency) or phase lead (for an increase in frequency) is imparted to the acoustic carrier signal. For example, if the acoustic carrier wave is obtained by operating a mud siren to obtain an acoustic carrier at 12 Hz, a phase lag may be obtained by momentarily lowering the frequency of the mud siren to 8 Hz. After the prescribed momentary period (e.g. 125 milliseconds), the frequency of rotation is returned to 12 Hz, but the momentary excursion to a lower frequency will be understood to have imparted a phase lag to the 12 Hz carrier signal with respect to the phase reference the carrier would have had if no frequency variation had been implemented. The uphole receiving subsystem includes transducer means for converting the modulated acoustic carrier waves to electronic signals and means for demodulating the electronic signals to recover the measurement information taken downhole.

In accordance with an important feature of the invention, filter means are provided for selectively filtering the electronic signals before the demodulation thereof. The filter means is provided with a bandpass characteristic having a center frequency which is displaced from the nominal frequency in the direction of the unidirectional decrease or increase of frequency applied when originally modulating the acoustic carrier waves. The center frequency is preferably offset from the nominal carrier frequency by an amount which is a function of the bit rate of the digital information, preferably an amount equal to one-half the bit rate of the digital information.

In the preferred embodiment of the invention, the bandpass characteristic of the filter means is skewed in the same direction as the offset. Thus, in the example where modulation is effected by momentary unidirectional lowering of the carrier frequency to effect the PSK modulations, the center frequency of the filter bandpass spectrum will be at a frequency that is less than the nominal frequency, and the bandpass characteristic will be skewed such that the power spectrum thereof will be of disproportionately greater magnitude toward the lower frequency side of the bandpass center frequency.

Further features and advantages of the invention will become more readily apparent from the following detailed description when taken in conjunction with the accompanying drawings.

DESCRIPTION OF THE PREFERRED EMBODIMENT

Figure 1:
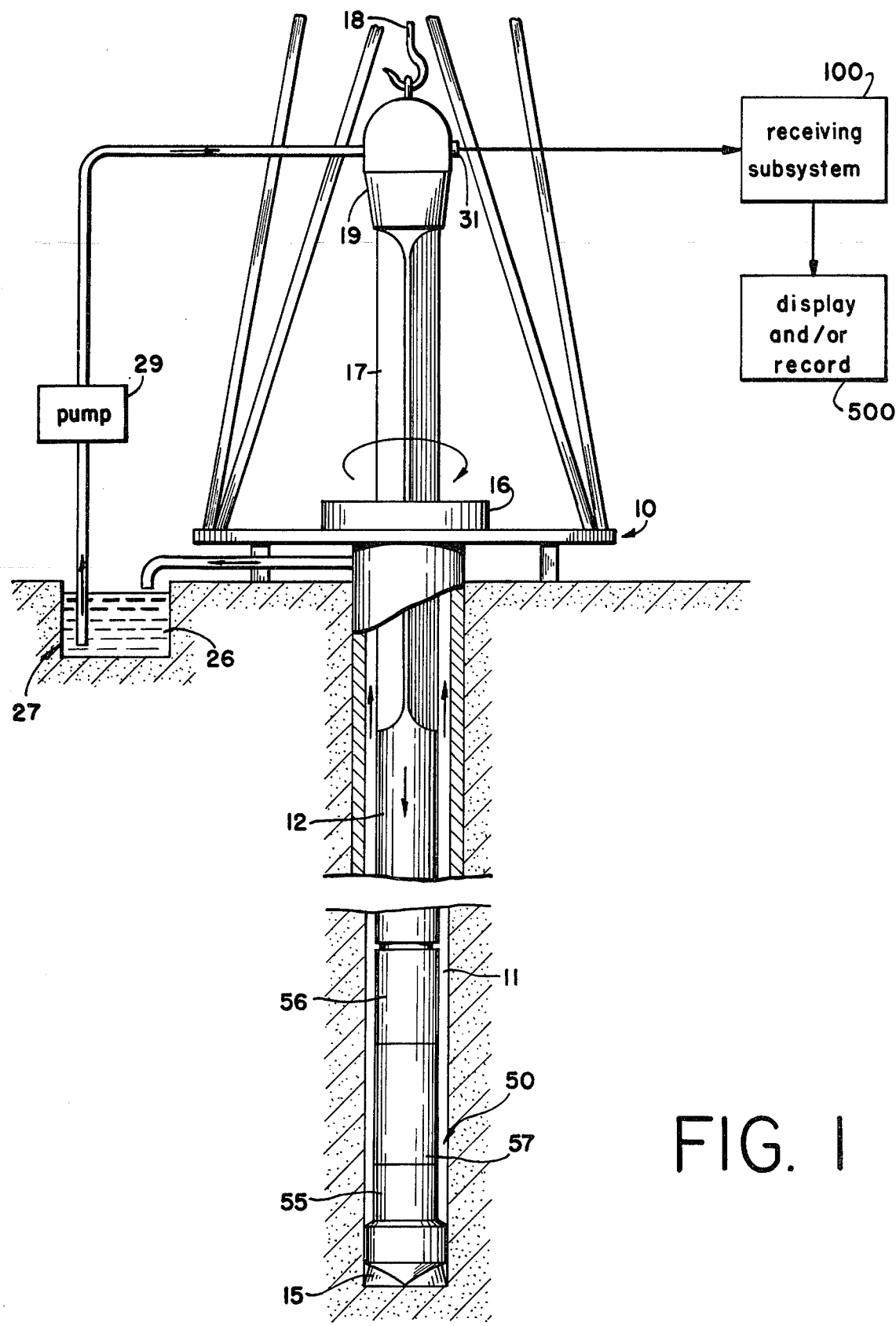
FIG. 1 is a simplified schematic diagram of a logging-while-drilling apparatus which includes the present invention.

Referring to FIG. 1, there is illustrated a simplified diagram of a logging-while-drilling apparatus in accordance with an embodiment of the present invention, as used in conjunction with a conventional drilling apparatus. A platform and derrick 10 are positioned over a borehole 11 that is formed in the earth by rotary drilling. A drill string 12 is suspended within the borehole and includes a drill bit 15 at its lower end. The drill string 12, and the drill 15 attached thereto, is rotated by a rotating table 16 (energized by means not shown) which engages a kelly 17 at the upper end of the drill string. The drill string is suspended from a hook 18 attached to a travelling block (not shown). The kelly is connected to the hook through a rotary swivel 19 which permits rotation of the drill string relative to the hook. Drilling fluid or mud 26 is contained in a pit 27 in the earth. A pump 29 pumps the drilling fluid into the drill string via a port in the swivel 19 to flow downward through the center of drill string 12. The drilling fluid exits the drill string via ports in the drill bit 15 and then circulates upward in the region between the outside of the drill string and the periphery of the borehole. As is well known, the drilling fluid thereby carries formation cuttings to the surface of the earth, and the drilling fluid is returned to the pit 27 for recirculation. The small arrows in FIG. 1 illustrate the typical direction of flow of the drilling fluid.

Mounted within the drill string 12, preferably near the drill bit 15, is a downhole sensing and transmitting subsystem 50. Subsystem 50 includes a measuring apparatus 55 which may measure any desired downhole condition, for example resistivity, gamma ray, weight on bit, tool face angle, etc. It will be understood, however, that the measuring apparatus 55 can be employed to measure any useful downhole parameter. The transmitting portion of the downhole subsystem includes an acoustic transmitter 56 which generates an acoustic signal in the drilling fluid that is representative of the measured downhole conditions. One suitable type of acoustic transmitter, which is known in the art, employs a device known as a "mud siren" which includes a slotted stator and a slotted rotor that rotates and repeatedly interrupts the flow of drilling fluid to establish a desired acoustic wave signal in the drilling fluid. Transmitter 56 is controlled by transmitter control and driving electronics 57 which includes analog-to-digital (A/D) circuitry that converts the signals representative of downhole conditions into digital form. The control and driving electronics 57 also includes a phase shift keying (PSK) modulator which produces driving signals for application to the transmitter 56.

Figure 2:
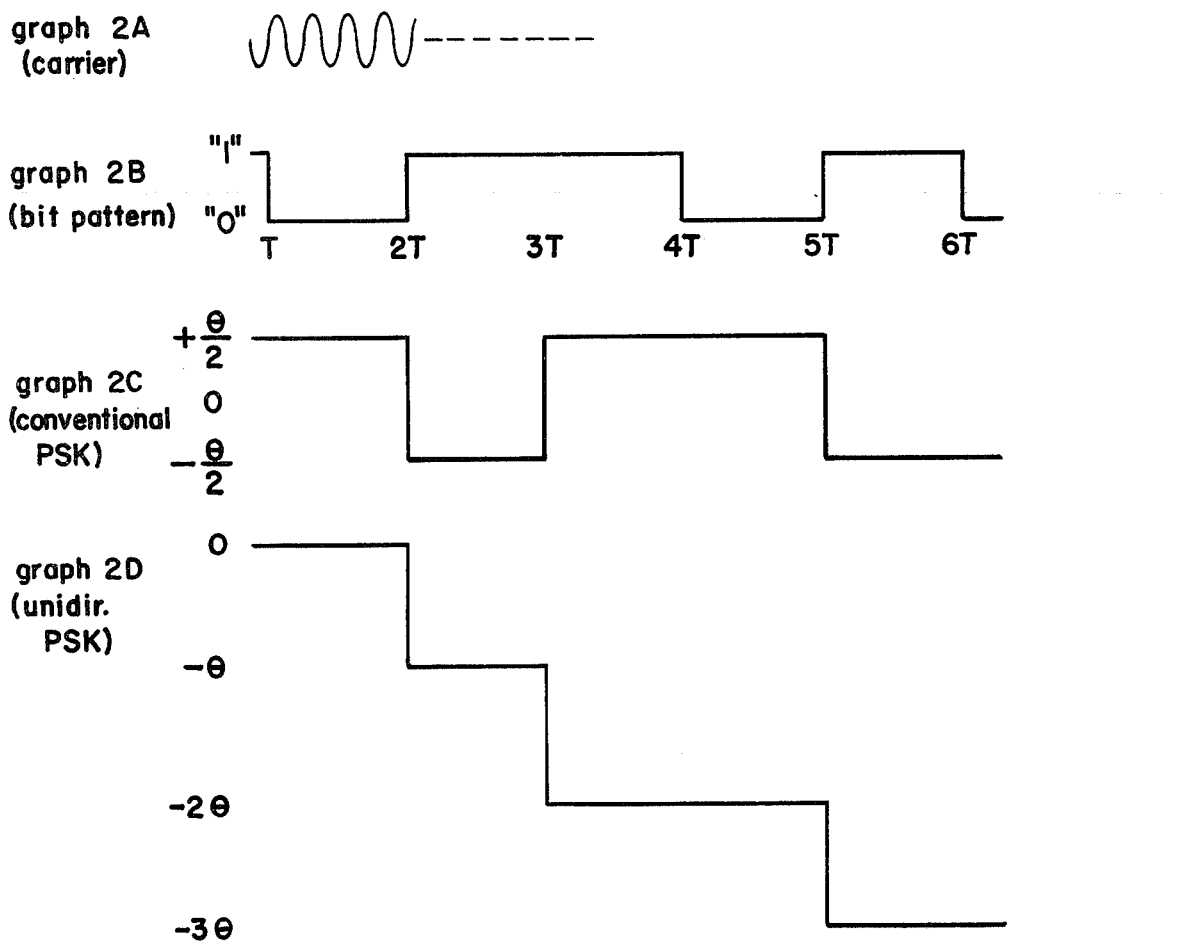
FIG. 2 includes graphs which illustrate conventional PSK modulation and unidirectional ramp phase PSK modulation utilized in the present invention.

In conventional phase shift keyed (PSK) communications, the phase of a carrier signal is changed in accordance with a digital data signal having two or more levels to produce a modulated carrier having two or more phases. The carrier phase is conventionally changed in alternate directions (that is, alternating lead and lag) so that the net change in carrier phase over a long period of time is close to zero. In a logging-while-drilling system wherein an electromechanical device, such as a mud siren, is employed to impart acoustic waves to the drilling fluid, it is preferable to effect all phase changes in the same direction (i.e. either all lags or all leads) which results in the technique for driving the mud siren being more efficient and straightforward. As used herein, the term "unidirectional" PSK modulation is intended to mean this type of modulation wherein all phase changes are in the same direction. Techniques for driving a mud siren to obtain a PSK modulated acoustic carrier wave in drilling fluid, and to obtain unidirectional PSK modulation thereof, are disclosed, for example, in the U.S. Pat. Nos. 3,789,355 and 3,820,063. It will be understood, however, that any suitable means can be employed for obtaining the types of unidirectional PSK modulation described herein. FIG. 2 illustrates the difference between conventional PSK modulation and the unidirectional PSK modulation utilized in a logging-while-drilling system. Graph 2A illustrates an unmodulated carrier signal having a period of T/4 where T is the bit period of the modulating information. An exemplary bit pattern is shown in graph 2B, with "0" to "1" transitions occurring at times 2T and 5T, and "1" to "0" transitions occurring at times T, 4T, and 6T. If a conventional "differentially encoded PSK" coding scheme is employed, a phase change at the bit time epoch (T, 2T, 3T, 4T . . . ) is indicative of a "1" bit, whereas the absence of a phase change at the bit time epoch is indicative of a "0" bit. It will be understood, however, that the opposite convention can be employed, or that any suitable coding scheme could be employed, consistent with the present invention. Accordingly, in graph 2C where conventional PSK modulation is illustrated, a phase change of $\theta$ is implemented each time the next bit is a "1", which means that phase changes are effected at times 2T, 3T and 5T. Thus, graph 2C shows phase changes as being effected at these times, with the phase changes alternating in direction. Graph 2D illustrates the nature of the PSK modulation in an unidirectional PSK modulation as used herein. Phase changes are seen to be effected at the same places, but in this illustrative example each phase change is negative (i.e. resulting in a phase lag) and the phase changes are seen to accumulate.

Referring again to FIG. 1, the generated acoustic wave (i.e., the primary component thereof to be received) travels upward in the fluid through the center of the drill string at the speed of sound in the fluid. The acoustic wave is received at the surface of the earth, by transducers represented by reference numeral 31. The transducers, which may for example be piezoelectric transducers, convert the received acoustic signals to electronic signals. The output of the transducers 31 is coupled to the uphole receiving subsystem 100 which is operative to demodulate the transmitted signals and display the downhole measurement information on display and/or recorder 500.

Figure 3:
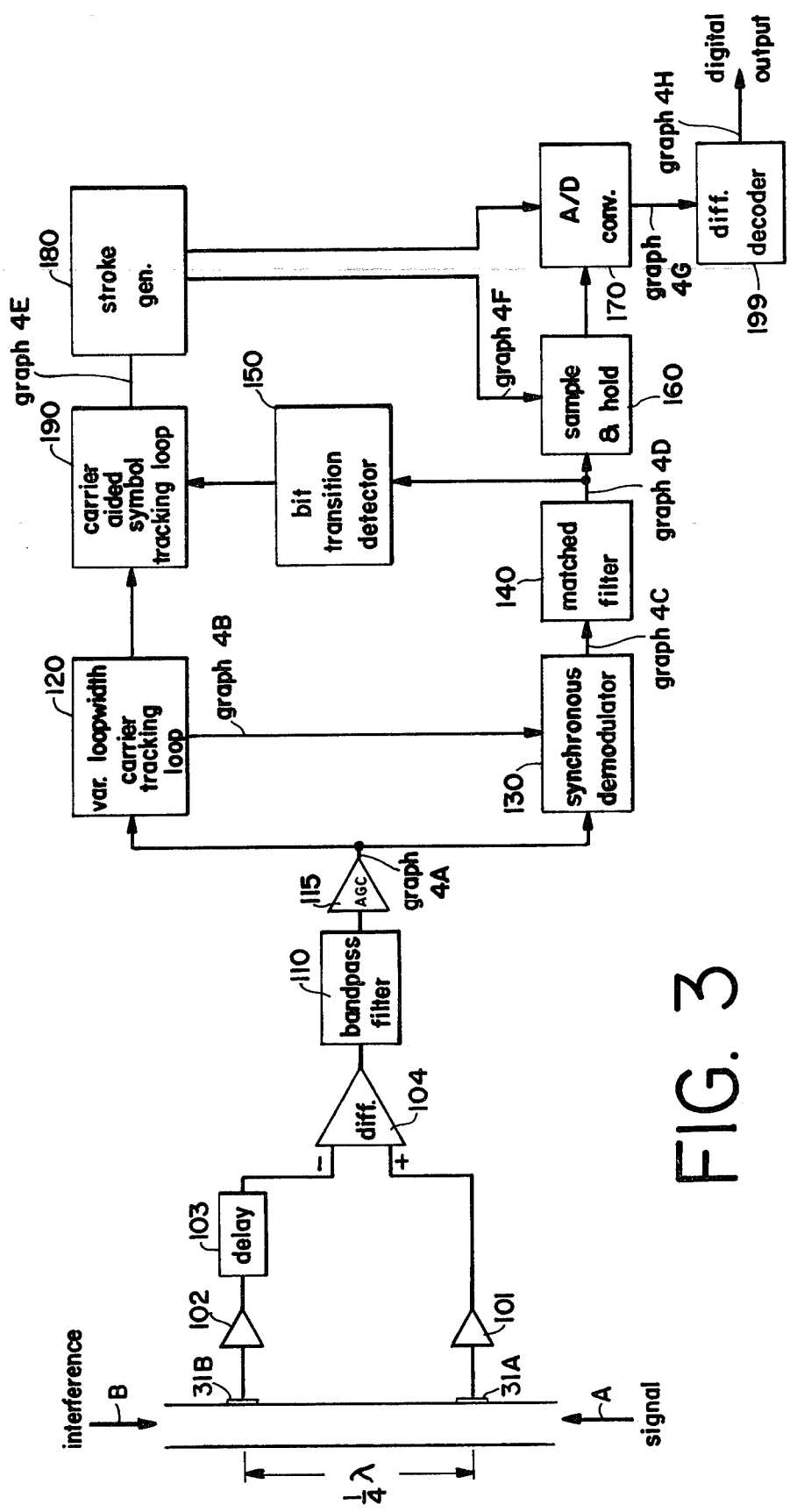
FIG. 3 is a block diagram of the uphole receiving subsystem of the FIG. 1 apparatus.

Referring to FIG. 3, there is shown a block diagram of the uphole receiving subsystem which includes an improved filter in accordance with the invention. The waveforms of FIG. 4, which show an exemplary bit pattern "1101" will be referred to from time to time to illustrate operation. The acoustic signals in the borehole fluid are sensed by transducers 31 (FIG. 1) which, in the present embodiment comprises transducers 31A and 31B. In the present embodiment, this pair of transducers is utilized in conjunction with a differential detection arrangement that includes delay 103 and difference amplifier 104. The output of transducer 31B is coupled, via buffer amplifier 102 and delay 103, to the negative input terminal of the difference amplifier 104. The transducer 31A is coupled, via buffer amplifier 101, to the positive input terminal of difference amplifier 104. This differential detector arrangement is employed for the purpose of rejecting noise traveling in a direction of propagation that is opposed to that of the primary acoustic carrier wave. For example, if the distance between transducers 31A and 31B is selected as being a quarter wavelength at the carrier frequency, and the delay 103 is also set at a quarter wavelength at the carrier frequency, acoustic waves traveling in the direction of the primary signal (arrow A) will experience a total of one-half wavelength of phase retardation. When the output of delay 103 is subtracted from the undelayed signal from transducer 31A, signals traveling in the direction of arrow A are seen to add in phase. However, acoustic signals traveling in the opposite direction (arrow B) will result in inputs to the differential amplifier 104 that are in phase, thereby resulting in the cancellation of these signals. This is readily seen by recognizing that, in such case, the input to the positive input terminal of differential amplifier 104 experiences a quarter wavelength delay due to the transducer spacing, whereas the input to the negative input terminal of the differential amplifier 104 experiences a quarter wavelength delay due to the electrical delay 103.

The output of differential amplifier 104 is coupled to a bandpass filter 110 which has a filter characteristic in accordance with the principles of the present invention and which will be described in further detail hereinbelow.

The output of filter 110 is coupled to an automatic gain control (AGC) amplifier 115 which is provided with a fast-attack slow-release characteristic. The fast-attack mode is useful in achieving stability and sync lock in a minimum time, and the slow release mode maintains the gain during momentary loss or level change of signal. The output of AGC amplifier 115 (shown in idealized form in graph 4A) is coupled to both a synchronous demodulator 130 and variable loopwidth carrier tracking loop 120. The variable loopwidth carrier tracking loop 120 is described in further detail in the copending U.S. patent application Ser. No. 881,460, filed of even date herewith and assigned to the same assignee as the present application. As described in the referenced application, the circuit's variable loopwidth can be operated in either a manual or an automatic mode. In the manual mode of operation, the carrier tracking loop will operate in a particular fixed loopwidth (for example, wide, medium or narrow) in accordance with operator selection. These loopwidths may be, for example, 0.3 Hz, 0.1 Hz and 0.03 Hz, respectively, covering a ten to one range. The wide or medium loopwidth will typically be utilized when acquiring lock, and the narrow loopwidth will be switched in once lock has been acquired, so as to enhance the loop stability. In the automatic mode of operation, the loop will initially acquire synchronization using the widest loopwidth (or the medium loopwidth, if so desired under certain conditions). After acquiring synchronization, the loopwidth is switched to a narrower value. When a signal loss occurs, as indicated by an output from a signal loss detector in the circuit 120, the loopwidth is again switched to its widest setting. In either the manual or automatic mode of operation, the variable loopwidth carrier tracking loop may be provided with circuitry for precharging certain capacitors therein which are switched into and out of operation when switching loopwidths. As described in the referenced copending U.S. patent application Ser. No. 881,460, this technique is advantageous in preventing possible loss of lock when, for example, switching to a narrower loopwidth, as might be caused by transient voltages resulting from the initial voltages across capacitors that are switched into operation in the circuit.

As described in the referenced copending U.S. patent application Ser. No. 881,460, the output of the variable loopwidth carrier tracking loop circuit 120 is derived from the output of a voltage controlled oscillator (VCO) in the phase locked loop of the circuit. This oscillator typically operates at a multiple of the nominal carrier frequency. A clock generator, which includes a frequency divider, therefore derives a clock signal from this VCO output, the derived clock signal (which is illustrated in graph 4B) being at the carrier frequency and in a form suitable for use in demodulating the filtered input signal. The clock generator in circuit 120 may include clock correction circuitry of the type set forth in the referenced copending U.S. patent application Ser. No. 881,461, filed of even date herewith, and assigned to the same assignee as the present application. As described in detail in that application, the unidirectional nature of the PSK modulated carrier signal results in a buildup of error signal components in the carrier tracking loop. If not accounted for, such as by using clock correction circuitry described in the referenced application, the buildup or error component signals can cause an undesirable drift of the voltage controlled oscillator in the carrier tracking loop. As set forth in the referenced copending application, this undesirable buildup of error components can be eliminated by providing offsetting pulses which tend to cancel the error signals that would otherwise accumulate. Since the type of error signals under consideration occur at each bit transition, the output of a bit transition detector 150 (to be described further hereinbelow) is used to regulate the generation of correction pulses.

The output of the carrier tracking loop circuit 120 (graph 4B) is coupled to the synchronous demodulator 130 which, as noted above, receives as its other input the output of AGC amplifier 115 which is to be demodulated. The synchronous demodulator may be, for example, an analog multiplier. Its demodulated output is illustrated by the waveform of graph 4C. The output of the synchronous demodulator 130 is coupled to a matched filter 140. The filter 140 is matched to a square pulse at the bit rate. As is known in the art, the matched filter is operative, upon a data transition at its input, to integrate for a time equal to one bit period. Accordingly, at the end of each bit period, the output of the matched filter is at an extreme positive or negative value (waveform of graph 4D) at which sampling can be most efficiently achieved. Sampling of the output of matched filter 140 is performed by a sample and hold circuit 160 whose output is coupled to an analog-to-digital converter 170 that generates a signal in digital form. (The output of matched filter 140 is also coupled to bit transition detector 150, which may include a zero crossing detector that senses zero crossings of the matched filter output to produce output pulses having a phase which is synchronized with the bit transitions. Use of the transition detector output is referred to directly hereinbelow.) The signal utilized to trigger sampling by the sample and hold circuit 160 and to define the conversion period of the analog-to-digital converter 170 is generated by a strobe generator 180. The sampling signal produced by the strobe generator (waveform of graph 4F) is seen to be at the bit or symbol rate. To obtain this relatively accurate signal at the bit rate, a carrier-aided symbol tracking loop 190 may be employed. The carrier-aided symbol tracking loop is described in the copending U.S. patent application Ser. No. 684,604, assigned to the same assignee as the present application. Briefly, the circuit 190 is a squaring type of phase-locked loop which includes a voltage controlled oscillator and a frequency divider in the loop. In this respect, the circuit is like a conventional bit synchronizer. However, as described in the referenced copending U.S. patent application, in addition to the tracking loop receiving timing information when a transition is detected in the received signal (i.e., the output of bit transition detector 150 in FIG. 3), the output of the carrier tracking loop 120 is also used to aid the symbol tracking loop 190 (output illustrated in graph 4E) during those periods where symbol transitions are absent. This is made possible by the coherent relationship between the carrier and bit rates. If after a number of bit periods there are no bit transitions, a signal derived from the carrier is used to maintain synchronization.

The bit pattern output of A/D converter 170, for this example, is illustrated in graph 4G, and can be seen to result from the sampling of the matched filter output (graph 4D) with the strobe signal (graph 4F) and subsequent A/D conversion. Since the data was originally encoded in conventional "differential encoded PSK" form (as described above), a differential decoder 199 is employed to recover the data in its original form. In particular, since a change in phase was indicative of a "1" in the encoding scheme, a bit change in the output of A/D converter 170 (graph 4G) is interpreted as a "1" by the differential decoder 199. Conversely, the absence of a bit change in the A/D converter output is interpreted as a "0". Accordingly, and as is known in the art, the differential decoder includes an exclusive-OR gate which operates on successively received bits and generates a "1" output when successive bits are different and a "0" output when successive bits are the same. The output of differential decoder 199 is illustrated in FIG. 4H for the present example.

Figure 4:
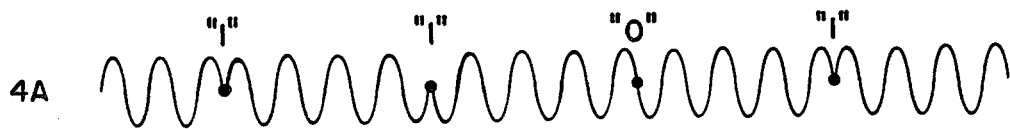
FIG. 4 illustrates idealized waveforms useful in understanding the nature of signals which appear at various locations of the receiving subsystem circuitry of FIG. 3.
Figure 4:
Figure 4:
Figure 4:
Figure 4:
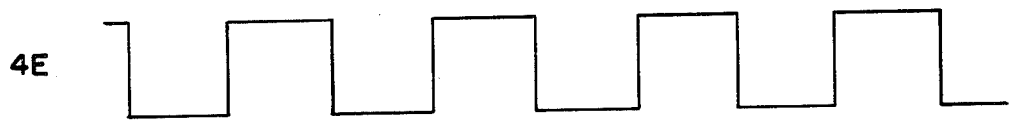
Figure 4:
Figure 4:
Figure 5:
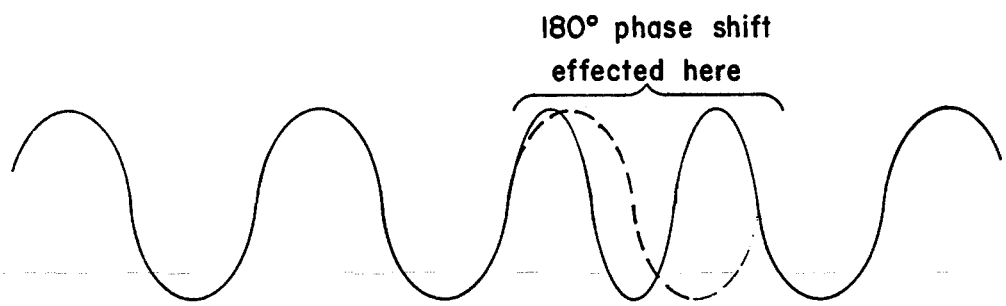
FIG. 5 illustrates the nature of a phase change as implemented in accordance with the PSK modulation of FIG. 2.

It will be understood that in the graph 4A of FIG. 4, the PSK modulation was illustrated in idealized form, with "instantaneous" phase changes, to facilitate understanding of operation of the system of FIG. 3. The actual phase changes are implemented in the manner illustrated in conjunction with graph 2D. FIG. 5 illustrates such a phase change, effected by momentary lowering of the carrier frequency until the desired phase shift is achieved. The dashed line shows what the carrier waveform would look like without the frequency modification.

In an embodiment of the present invention, the carrier frequency is 12 Hz and the bit rate is 1.5 Hz. Unidirectional PSK modulation is implemented by momentarily lowering the carrier frequency to 8 Hz until a 180° phase lag has been achieved, and then restoring the carrier to its nominal 12 Hz frequency. (The desired lag is one-half the period of the nominal carrier frequency. A frequency of 8 Hz has a period which is 1½ times the period of the nominal carrier frequency. Accordingly, after one full cycle at 8 Hz (125 millisec.) the desired phase lag will be obtained. This is readily seen from FIG. 5 wherein the solid line waveform changes to 8 Hz for one cycle while the dashed line waveform illustrates continuation at a 12 Hz frequency. However, since it takes a finite time to change between the two frequencies—and during the transition the average frequency is less than 12 Hz—the actual time spent at 8 Hz is slightly less than 125 ms.) Techniques for driving the mud siren in this manner are known in the art, e.g. in the above-referenced U.S. Pat. Nos. 3,789,355 and 3,820,063.

Figure 6A:
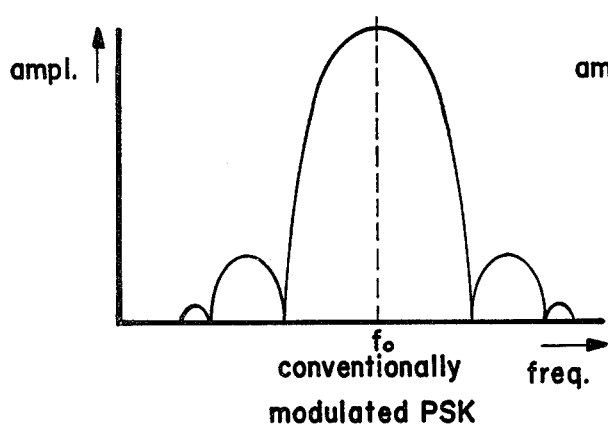
FIG. 6 illustrates the nature of the frequency spectrum of a conventional PSK modulated signal as compared to the spectrum of a unidirectional PSK modulated signal.
Figure 6B:
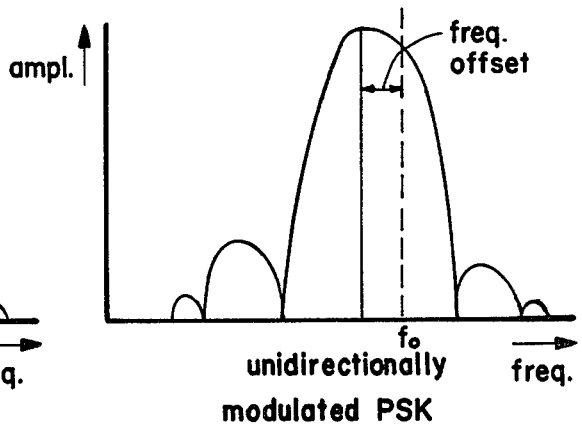

Applicant has noted that the unidirectional phase shifting of the carrier causes the modulated signal spectrum to be shifted in frequency from the nominal carrier frequency. The frequency shift, or offset, is accompanied by an asymmetry, or skewing, in the spectrum. FIG. 6B illustrates the nature of the unidirectional PSK frequency spectrum, and can be compared to the frequency spectrum of a conventional PSK modulated signal having the same nominal carrier frequency, $f_o$. The use of a bandpass filter (e.g. filter 110 of FIG. 3) which takes account of this offset and asymmetry of the frequency spectrum of the modulated signal, is advantageous in more efficiently separating the signal from the noise and minimizing distortion of the signal by the filter. The precise degree of spectrum offset and asymmetry depends upon the data pattern of the modulation. For example, an alternating "1", "0" data pattern would result in an offset by an amount equal to about the bit rate. Any other data pattern would result in an offset of somewhat less than the bit rate. If the data pattern is not known a priori (as is generally the case), a random data pattern can be assumed and such a pattern results in an offset from the carrier frequency of approximately one-half the bit rate. For example, in the present embodiment wherein the carrier is at 12 Hz, the bit rate is at 1.5 Hz, and wherein PSK modulation is achieved by unidirectional momentary decreasing of frequency, the preferred filter center frequency of the bandpass filter would be at 11.25 Hz; i.e., the nominal carrier frequency minus half the bit rate. (It will be understood that if phase shifting were achieved by unidirectional momentary increases in frequency, the offset would be toward the higher frequencies and would lie at 12.75 Hz for such case.)

Consistent with principles of the present invention, there are various ways in which the bandpass filter can be designed. The bandwidth of the filter is chosen to pass the modulated signal with a minimum of distortion while suppressing spurious noise and interference. The minimum bandwidth ($-3$ dB to $-3$ dB) for filtering in a PSK system is typically equal to the bit rate, although a somewhat wider bandwidth, for example of 1.5 times the bit rate, is generally recommended. In designing the bandpass filter, the following steps can be followed: First, a low pass filter prototype is selected and it is scaled to have a bandwidth equal to one-half of the desired bandpass filter bandwidth. The low pass filter design is next translated to a bandpass filter centered at a frequency which is offset from the carrier frequency in accordance with the rules set forth above. The bandpass filter transfer function zeros are then selected to provide the desired filter symmetry (or asymmetry) characteristics. A particular filter configuration is then adopted and the filter component values therefor are computed.

An example of a filter designed in accordance with this procedure is as follows: Because the signal is a phase modulated signal, a linear phase lowpass filter such as the Bessel filter is selected. A second order filter prototype is selected with a normalized transfer function of:

$$H(s) = \frac{1.6180339}{S^2 + 2.2032S + 1.6180339}$$

$$= \frac{1.6180339}{(S + 1.1016 + j0.6364)(S + 1.1016 - j0.6364)}$$

This prototype is 3 dB down at $W = 1$ rad/sec. Next, assume that a 3 Hz bandpass filter bandwidth is required. The lowpass filter is scaled to a $-3$ dB bandwidth $= (\frac{1}{2}) \times 3$ Hz $= 1.5$ Hz. Replacing s by $s/(1.5)(2\pi)$ gives $$H_1(s) = \frac{143.724}{S^2 + 20.764S + 143.724}$$

The lowpass design is then translated to a bandpass design using an arithmatic transform. One method of doing this is to shift the filter poles by an amount equal to the desired center frequency. That is, generally for $$(S + \sigma + jW_1) \rightarrow S + \sigma + j(W_1 + W_c)$$

where $W_c =$ desired center frequency For $$H_1(s) = \frac{143.724}{(S + 10.3823 + j5.9979)(S + 10.3823 - j5.9979)}$$

The translated factors are $$H_2(s) = \frac{N(s)}{(S^2 + 20.764S + 5987.63)(S^2 + 20.764S + 4292.79)}$$

The numerator, $N(s)$, is next chosen as having transmission zeros at DC. If a symmetric response were desired the number of zeros at DC would be chosen to make the asymptotic response on either side of the center frequency the same. In such case:

$$N(s) = KS^2$$

However, an asymmetric response is preferred to more closely match the signal spectrum, so an unbalanced number of zeros are added at DC. For an asymmetrical response, we have:

$$N(s) = KS^m$$

The integer exponent, m, is chosen to provide the desired filter asymmetry. If the denominator polynominal in the aforementioned transfer function, $H_2(s)$, is of an even order, n, then a symmetric filter response is obtained by chosing $m = n/2$. The filter response may be skewed toward a lower frequency by chosing $m = n/2 - 1$. The filter response may be skewed toward a higher frequency by chosing $m = n/2 + 1$. The degree of skewing is not limited by changing the order of $N(s)$ by one and may be increased or decreased by any integer so long as the order of $N(s)$ is greater than or equal to zero and less than or equal to the order of the denominator.

In the present embodiment the signal spectrum is skewed toward low frequencies. Using the aforementioned design example, the numerator, N(s), would be chosen to be:

$$N(s) = KS$$

This choice skews the filter response toward the low frequencies. The constant, K, is chosen to provide the desired passband gain.

Figure 7A:
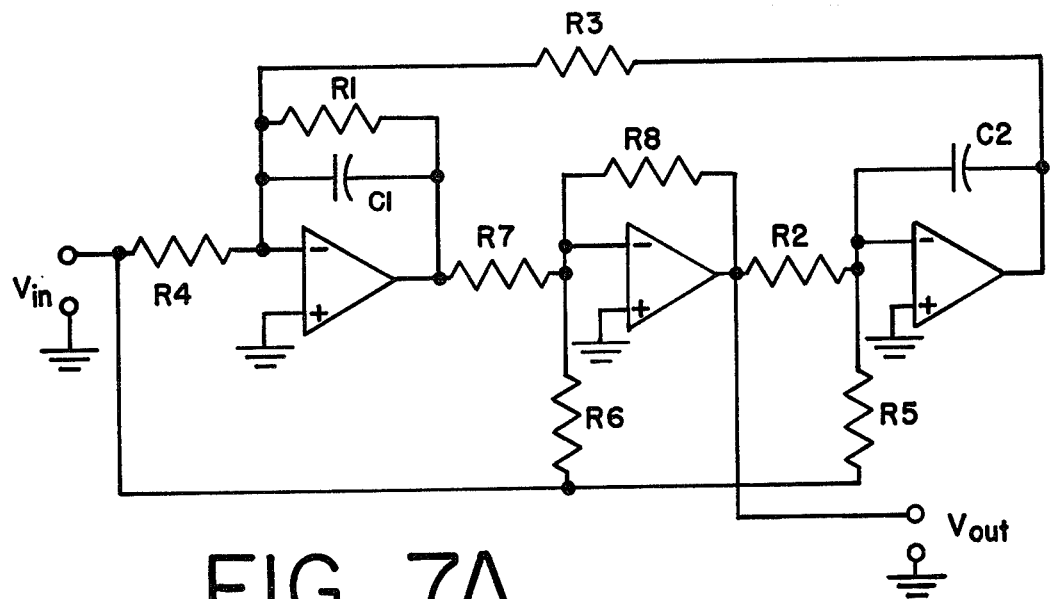
FIG. 7 illustrates an example of a filter which is useful in the present invention.
Figure 7B:
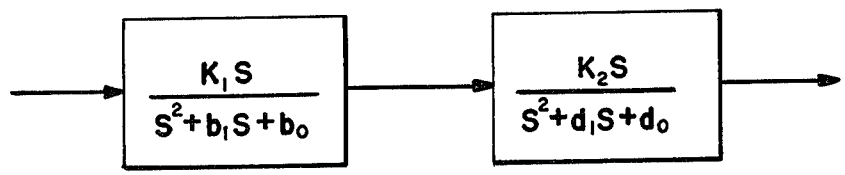

The filter whose transfer function is set forth can be realized using a cascade of two active RC biquadratic filter sections. A feedforward circuit configuration as described in "Design Formulas for Biquad Active Filters Using Three Operational Amplifiers", by Fleischer & Tow, Proc. of the IEEE, May 1973, can be used. FIG. 7A illustrates a typical circuit including three operational amplifiers and components configured as shown. To realize two cascaded bandpass sections, R5 and R6 are set equal to infinity; i.e., open circuits. The remaining component values can be selected in accordance with the design parameters presented in the referenced article. The final filter can be composed of the two cascaded active RC biquad sections, as represented by the transfer functions of FIG. 7B, with $$b_1 = 20.764 = d_1$$

$$b_0 = 5987.63$$

$$d_0 = 4292.79$$

$$K_1 = K_2 = \sqrt{K}$$

For the first biquad filter section the design formulae of Fleischer & Tow may be used to compute the values of the filter components. For example, for the first section $R_8$ and $C_1 = C_2$ are chosen by the designer
$K_1 = K_2$ are chosen by the designer Then:

$$R_1 = \frac{1}{b_1} C_1 \qquad R_4 = \frac{1}{K_2 C_1}$$

$$R_2 = \frac{K_1}{\sqrt{b_0} \, C_2} \qquad R_5 = R_6 = \infty \text{ [i.e. open circuit]}$$

$$R_3 = \frac{1}{K_1 K_2 \sqrt{b_0} \, C_1} \qquad R_7 = K_2 R_8$$

The foregoing is one non-limiting example of how one can design a bandpass filter which is useful in accordance with the principles of the invention, and various alternate design techniques can be employed.

The invention has been described with reference to a particular preferred embodiment, but variations within the spirit and scope of the invention will occur to those skilled in the art. For example, the invention is described in the context of a particular receiving system, as illustrated in FIG. 2, but it will be understood that the invention can be employed in other types of receiving systems wherein unidirectional PSK modulated signals are to be processed.

I claim:

1. In an apparatus which receives a PSK signal modulated with digital information and is operative to recover the digital information therefrom, said PSK modulated signal having been modulated with the digital information by momentarily unidirectionally either decreasing or increasing the nominal frequency of a carrier signal as a function of the digital information to effect a phase change; an improved filter for use in selectively filtering the modulated carrier signal, said filter having a bandpass center frequency which is offset from the nominal carrier frequency in the direction of said unidirectional decrease or increase of frequency.

2. The filter as defined by claim 1 wherein said center frequency is offset from the nominal carrier frequency by an amount which is a function of the bit rate of said digital information.

3. The filter as defined by claim 2 wherein said center frequency is offset from the nominal carrier frequency by an amount equal to one-half the bit rate of said digital information.

4. The filter as defined by claim 1 wherein the bandpass characteristic of said filter is skewed in the same direction as said offset.

5. The filter as defined by claim 2 wherein the bandpass characteristic of said filter if skewed in the same direction as said offset.

6. The filter as defined by claim 3 wherein the bandpass characteristic of said filter is skewed in the same direction as said offset.

7. In an apparatus which receives a PSK signal modulated with digital information and is operative to recover the digital information therefrom, said PSK modulated signal having been modulated with the digital information by momentarily unidirectionally either decreasing or increasing the nominal frequency of a carrier signal as a function of the digital information to effect a phase change; and then returning the carrier to nominal frequency once the phase change has been effected; an improved filter for use in selectively filtering the modulated carrier signal, said filter having a bandpass characteristic which is skewed in the direction of said unidirectional decrease or increase of frequency.

8. A logging-while-drilling apparatus for obtaining subsurface measurements during drilling in a fluid-filling borehole and for communicating the measurements to the surface of the earth, comprising:

a downhole sensing and transmitting subsystem including
means mountable on a drill string for obtaining measurement information;
means for generating acoustic carrier waves at a nominal frequency in the borehole fluid;
means for PSK modulating the generated acoustic carrier waves in accordance with digital data representative of said measurements by momentarily unidirectionally either decreasing or increasing the frequency of said acoustic carrier signal; and an uphole receiving subsystem including
transducer means for converting the modulated acoustic carrier waves to electronic signals;
filter means for selectively filtering said electronic signals, said filter means having a center frequency which is displaced from said nominal frequency in the direction of the unidirectional decrease or increase of frequency applied when originally modulating said acoustic carrier waves; and
means for extracting the digital data from the filtered electronic signals.

9. Apparatus as defined by claim 8 wherein said center frequency is offset from the nominal carrier frequency by an amount which is a function of the bit rate of said digital information.

10. Apparatus as defined by claim 9 wherein said center frequency is offset from the nominal carrier frequency by an amount equal to one-half the bit rate of said digital information.

11. Apparatus as defined by claim 8 wherein the bandpass characteristic of said filter means is skewed in the same direction as said offset.

12. Apparatus as defined by claim 9 wherein the bandpass characteristic of said filter means is skewed in the same direction as said offset.

13. Apparatus as defined by claim 10 wherein the bandpass characteristic of said filter means is skewed in the same direction as said offset.

14. A logging-while-drilling apparatus for obtaining subsurface measurements during drilling in a fluid-filled borehole and for communicating the measurements to the surface of the earth, comprising:
   a downhole sensing and transmitting subsystem including
      means mountable on a drill string for obtaining measurement information;
      means for generating acoustic carrier waves at a nominal frequency in the borehole fluid;
      means for PSK modulating the generated acoustic carrier waves in accordance with digital data representative of said measurements by momentarily unidirectionally either decreasing or increasing the frequency of said acoustic carrier waves; and
   an uphole receiving subsystem including
      transducer means for converting the modulated acoustic carrier waves to electronic signals; and
      filter means for selectively filtering said electronic signals, said filter means having a bandpass characteristic which is skewed in the direction of said unidirectional decrease or increase of frequency.

15. In a logging-while-drilling apparatus for obtaining subsurface measurements during drilling in a fluid-filled borehole and for communicating the measurements to the surface of the earth, the apparatus including
   a downhole sensing and transmitting subsystem including
      means mountable on a drill string for obtaining measurement information;
      means for generating acoustic carrier waves at a nominal frequency in the borehole fluid;
      means for PSK modulating the generated acoustic carrier waves in accordance with digital data representative of said measurements by momentarily unidirectionally either decreasing or increasing the frequency of said acoustic carrier signal; and
   an uphole receiving subsystem including
      transducer means for converting the modulated acoustic carrier waves to electronic signals; and
      means for extracting the digital data from the electronic signals;
   the improvement comprising a filter for selectively filtering said electronic signals, said filter having a center frequency which is displaced from said nominal frequency in the direction of the unidirectional decrease or increase of frequency applied when originally modulating said acoustic carrier waves.

16. The filter as defined by claim 15 wherein said center frequency is offset from the nominal carrier frequency by an amount which is a function of the bit rate of said digital information.

17. The filter as defined by claim 16 wherein said center frequency is offset from the nominal carrier frequency by an amount equal to one-half the bit rate of said digital information.

18. The filter as defined by claim 15 wherein the bandpass characteristic of said filter is skewed in the same direction as said offset.

19. The filter as defined by claim 16 wherein the bandpass characteristic of said filter is skewed in the same direction as said offset.

20. The filter as defined by claim 17 wherein the bandpass characteristic of said filter is skewed in the same direction as said offset.

21. In a logging-while-drilling apparatus for obtaining subsurface measurements during drilling in a fluid-filled borehole and for communicating the measurements to the surface of the earth, the apparatus including
   a downhole sensing and transmitting subsystem including
      means mountable on a drill string for obtaining measurement information;
      means for generating acoustic carrier waves at a nominal frequency in the borehole fluid;
      means for PSK modulating the generated acoustic carrier waves in accordance with digital data representative of said measurements by momentarily unidirectionally either decreasing or increasing the frequency of said acoustic carrier signal; and
   an uphole receiving subsystem including
      transducer means for converting the modulated acoustic carrier waves to electronic signals; and
      means for extracting the digital data from the electronic signals;
   the improvement comprising a filter for selectively filtering said electronic signals, said filter having a bandpass characteristic which is skewed in the direction of said unidirectional decrease or increase of frequency.

22. For use in conjunction with an apparatus which receives a PSK signal that was modulated with digital information by momentarily unidirectionally either decreasing or increasing the nominal frequency of a carrier signal as a function of the digital information to effect a phase change; an improved method of signal processing, comprising the steps of:
   filtering the modulated carrier signal with a filter having a bandpass center frequency which is offset from the nominal carrier frequency in the direction of said unidirectional decrease or increase of frequency; and
   recovering the digital information from the filtered signal.

23. For use in conjunction with an apparatus which receives a PSK signal that was modulated with digital information by momentarily unidirectionally either decreasing or increasing the nominal frequency of a carrier signal as a function of the digital information to effect a phase change; an improved method of signal processing, comprising the steps of:
   filtering the modulated carrier signal with a filter having a bandpass characteristic which is skewed in the direction of said unidirectional decrease or increase of frequency; and
   recovering the digital information from the filtered signal.

* * * * *